United States Patent
Qian et al.

(10) Patent No.: US 10,748,842 B2
(45) Date of Patent: Aug. 18, 2020

(54) PACKAGE SUBSTRATES WITH MAGNETIC BUILD-UP LAYERS

(71) Applicant: Intel Corporation, Santa Clara, CA (US)

(72) Inventors: Zhiguo Qian, Chandler, AZ (US); Kaladhar Radhakrishnan, Chandler, AZ (US); Kemal Aygun, Tempe, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/926,531

(22) Filed: Mar. 20, 2018

(65) Prior Publication Data

US 2019/0295936 A1    Sep. 26, 2019

(51) Int. Cl.
| | |
|---|---|
| *H01L 23/49* | (2006.01) |
| *H01L 23/498* | (2006.01) |
| *H01L 21/68* | (2006.01) |
| *H01L 21/48* | (2006.01) |
| *H01L 23/00* | (2006.01) |

(52) U.S. Cl.
CPC .... *H01L 23/49816* (2013.01); *H01L 21/4853* (2013.01); *H01L 21/68* (2013.01); *H01L 23/49827* (2013.01); *H01L 24/17* (2013.01); *H01L 2924/30111* (2013.01)

(58) Field of Classification Search
CPC ......... H01L 23/49816; H01L 23/49827; H01L 24/17
See application file for complete search history.

(56) References Cited

U.S. PATENT DOCUMENTS

| | | | | |
|---|---|---|---|---|
| 7,851,893 B2* | 12/2010 | Kim | ...................... | H01L 21/561 257/621 |
| 7,868,729 B2* | 1/2011 | Wang | .................. | H01F 17/0013 29/602.1 |
| 8,304,286 B2* | 11/2012 | Pagaila | ............... | H01L 23/3128 257/659 |
| 8,471,376 B1* | 6/2013 | Liou | ................. | H01L 23/49816 257/686 |
| 8,901,727 B2* | 12/2014 | Kang | .................... | H01L 21/563 257/686 |
| 9,343,432 B2* | 5/2016 | Lee | ....................... | H01L 23/3135 |
| 9,735,090 B2* | 8/2017 | Choi | ..................... | H01L 23/481 |
| 10,131,540 B2* | 11/2018 | Yu | .......................... | B81B 7/0051 |
| 2002/0027773 A1* | 3/2002 | Davidson | .............. | H01L 23/642 361/763 |

(Continued)

*Primary Examiner* — Ida M Soward
(74) *Attorney, Agent, or Firm* — Grossman, Tucker, Perreault & Pfleger PLLC

(57) ABSTRACT

The present disclosure is directed to systems and methods for improving the impedance matching of semiconductor package substrates by incorporating one or more magnetic build-up layers proximate relatively large diameter, relatively high capacitance, conductive pads formed on the lower surface of the semiconductor package substrate. The one or more magnetic layers may be formed using a magnetic build-up material deposited on the lower surface of the semiconductor package substrate. Vias conductively coupling the conductive pads to bump pads on the upper surface of the semiconductor package substrate pass through and are at least partially surrounded by the magnetic build-up material.

17 Claims, 9 Drawing Sheets

(56) References Cited

U.S. PATENT DOCUMENTS

| | | | |
|---|---|---|---|
| 2004/0262645 A1* | 12/2004 | Huff | H01Q 15/004 |
| | | | 257/232 |
| 2010/0047970 A1* | 2/2010 | Eichelberger | H01L 21/6835 |
| | | | 438/121 |
| 2013/0037944 A1* | 2/2013 | Lee | H01L 25/0657 |
| | | | 257/737 |
| 2013/0244490 A1* | 9/2013 | Rathburn | H05K 3/326 |
| | | | 439/628 |
| 2013/0275798 A1* | 10/2013 | Kondo | G06F 1/12 |
| | | | 713/500 |
| 2015/0177196 A1* | 6/2015 | Sussner | G01N 29/2406 |
| | | | 73/24.04 |
| 2016/0284981 A1* | 9/2016 | Bhushan | H01L 23/552 |
| 2016/0372412 A1* | 12/2016 | Choi | H01L 23/49838 |
| 2017/0025384 A1* | 1/2017 | Park | H01L 25/0657 |
| 2018/0240797 A1* | 8/2018 | Yokoyama | H01L 27/0886 |
| 2019/0035729 A1* | 1/2019 | Aoki | H01L 21/7682 |
| 2019/0238134 A1* | 8/2019 | Lee | H01L 23/5386 |
| 2019/0245543 A1* | 8/2019 | Lee | G11C 13/0007 |

* cited by examiner

PACKAGE SUBSTRATES WITH MAGNETIC BUILD-UP LAYERS

TECHNICAL FIELD

The present disclosure relates to semiconductor packaging.

BACKGROUND

Semiconductor package substrates couple semiconductor dies to external circuits, systems, or devices. The semiconductor package substrate typically includes numerous, relatively small, solder bumps or similar conductive structures on the "top" of the substrate to which the semiconductor dies and other components may couple and numerous, relatively large, conductive pads on the "bottom" of the substrate which are used to couple the package to external circuitry. Each of the solder bumps may be conductively coupled to a conductive pad using traces and/or vias formed in the layered semiconductor package substrate. For example, a semiconductor die containing one or more central processing units ("CPUs") may be coupled to a blade server motherboard using a semiconductor package substrate having a plurality of conductive elements. These conductive elements have a multitude of uses including grounding, power supply, and input/output (I/O) communication.

As CPU clock speeds increase, a demand arises for commensurate increases in communication speed between the CPU and external devices, such as I/O devices, to make full use of the computational power and speed of such processors. To reliably maintain high-speed I/O signals, it is desirable to match the impedance of the semiconductor package coupled to the substrate to external wiring and/or devices. The relatively large conductive pads used to couple the substrate to an external device or system demonstrate considerable capacitance and relatively low inductance, creating an impedance discontinuity between the semiconductor package and the external device or system. This impedance discontinuity restricts signaling bandwidth to and from the CPU and detrimentally limits the computing performance of the system.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1:
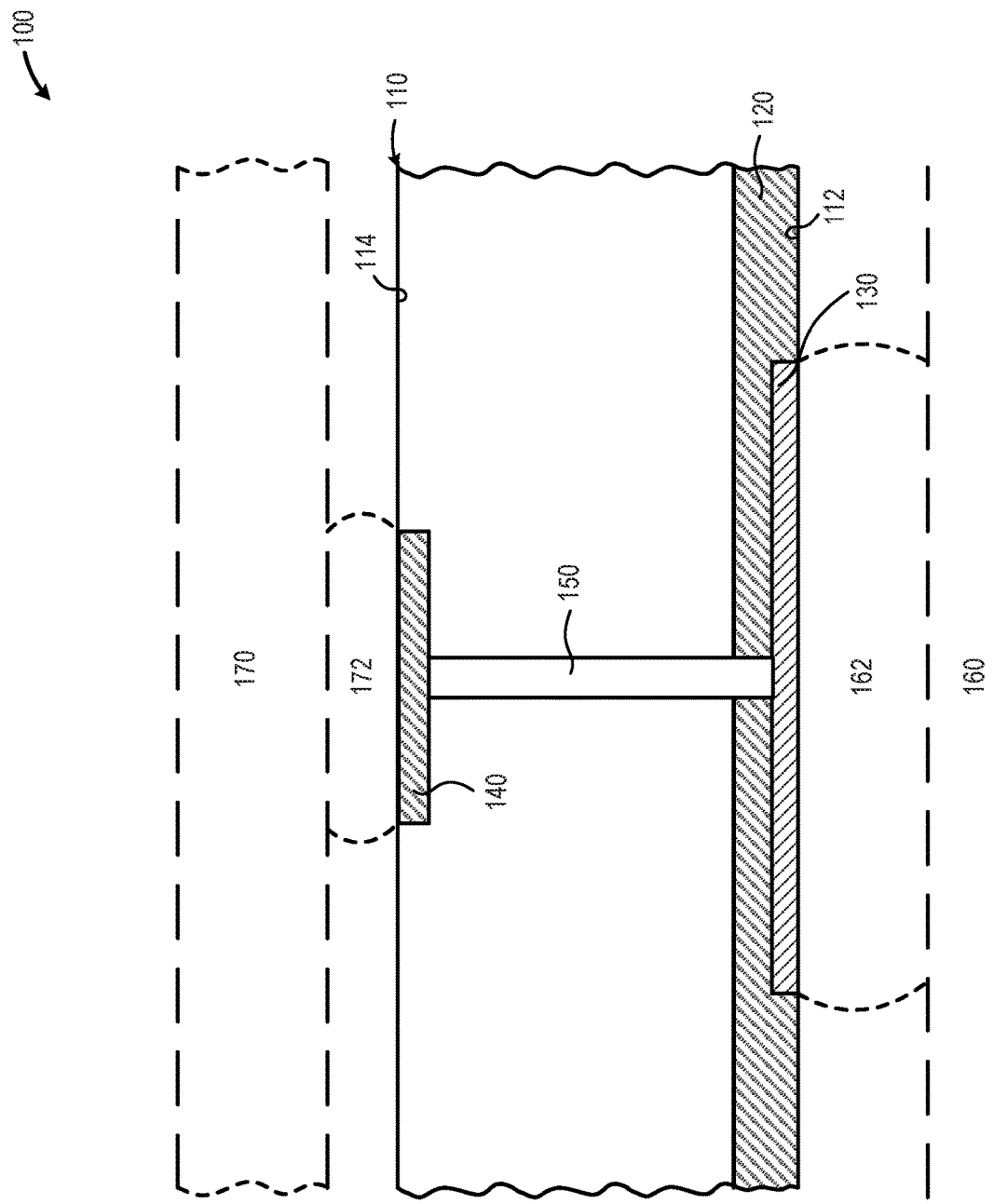
FIG. 1 is a partial cross-sectional elevation of an illustrative system that includes a semiconductor package substrate that includes at least one magnetic build-up layer disposed proximate a lower surface of the semiconductor package substrate, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The systems and methods described herein beneficially and advantageously improve system performance through the use of magnetic films as build-up layers in a semiconductor package substrate. The magnetic film build-up layers may be positioned proximate the capacitive conductive pads disposed across the lower surface of the semiconductor package substrate. The magnetic film may at least partially surround the stacked or staggered magnetic vias coupled to at least some of the conductive pads. The number and thickness of the magnetic layers used as build-up layers may be determined based on the desired impedance of the system as a whole (e.g., including the conductive pad on the lower surface of the semiconductor package substrate, the stacked or staggered vias, and/or the solder bump on the upper surface of the semiconductor package substrate. The systems and methods described herein beneficially and advantageously improve impedance matching without impacting the semiconductor package substrate manufacturing process by replacing one or more conventional substrate build-up layers with one or more magnetic substrate build-up layers. In embodiments, such magnetic build-up materials may have a magnetic permeability greater than 9 at frequencies up to 1 GHz.

A semiconductor interconnect is provided. The semiconductor interconnect may include: a substrate having a first surface and a transversely opposed second surface; at least one magnetic build-up layer disposed proximate the first surface of the substrate; a plurality of bump pads disposed across at least a portion of the second surface of the substrate; a plurality of conductive ball pads having a first capacitance at a first frequency disposed across at least a portion of the surface of the substrate, each of at least some of the plurality of conductive ball pads disposed proximate the at least one magnetic build-up layer; and a plurality of conductive vias, each of the plurality of vias conductively coupling at least one of the plurality of bump pads to a respective one of the plurality of conductive ball pads, the at least one magnetic build-up layer disposed about at least a portion of an external perimeter of each of at least some of the plurality of conductive vias.

A semiconductor interconnect fabrication method is provided. The method may include: disposing at least one magnetic build-up layer proximate at least a portion of a first surface of a substrate; forming a plurality of vias in the substrate, each of at least some of the plurality of vias passing through the at least one magnetic build-up layer such that the at least one magnetic build-up layer is disposed about at least a portion of an external perimeter of the respective via; forming a plurality of bump pads across at least a portion of a second surface of the substrate, the second surface transversely opposed across a thickness of the substrate to the first surface, conductively coupling each of at least a portion of the plurality of bump pads to a respective one of the plurality of vias; forming a plurality of conductive ball pads across at least a portion of the first surface of the substrate, each of at least a portion of the plurality of conductive ball pads disposed proximate the at least one magnetic build-up layer, each of the conductive ball pads having a first capacitance at a first frequency; and conductively coupling each of at least a portion of the plurality of conductive ball pads to a respective one of the plurality of vias.

A semiconductor interconnect system is provided. The system may include: means for disposing at least one magnetic build-up layer proximate at least a portion of a first surface of a substrate; means for forming a plurality of vias in the substrate, each of at least some of the plurality of vias passing through the at least one magnetic build-up layer such that the at least one magnetic build-up layer is disposed about at least a portion of an external perimeter of the respective via; means for forming a plurality of bump pads across at least a portion of a second surface of the substrate, the second surface transversely opposed across a thickness of the substrate to the first surface; means for conductively coupling each of at least a portion of the plurality of bump pads to a respective one of the plurality of vias; means for forming a plurality of conductive ball pads across at least a portion of the first surface of the substrate, each of at least a portion of the plurality of conductive ball pads disposed proximate the at least one magnetic build-up layer, each of the conductive ball pads having a first capacitance at a first frequency; and means for conductively coupling each of at least a portion of the plurality of conductive ball pads to a respective one of the plurality of vias.

An electronic device is provided. The electronic device may include: a system substrate and at least one semiconductor package coupled to system substrate. The at least one semiconductor package may include: a semiconductor die; and a semiconductor interconnect, comprising: a substrate having a first surface and a transversely opposed second surface; at least one magnetic build-up layer disposed proximate the first surface of the substrate; a plurality of bump pads to receive the semiconductor die disposed across at least a portion of the second surface of the substrate; a plurality of conductive ball pads having a first capacitance at a first frequency disposed across at least a portion of the surface of the substrate, each of at least some of the plurality of conductive ball pads disposed proximate the at least one magnetic build-up layer; and a plurality of conductive vias, each of the plurality of vias conductively coupling at least one of the plurality of bump pads to a respective one of the plurality of conductive ball pads, the at least one magnetic build-up layer disposed about at least a portion of an external perimeter of each of at least some of the plurality of conductive vias.

As used herein the terms "top" and "bottom" and/or "upper" and "lower" are used to denote a relative and not absolute physical geometry. For example, a feature described as on the "top" of a substrate may, in fact, be located or positioned on the "bottom" or even the "side" of the substrate depending on the physical orientation of the substrate. Such embodiments should be considered as included within the scope of this disclosure.

FIG. 1 is a partial cross-sectional elevation of an illustrative system 100 that includes a semiconductor package substrate 110 that includes at least one magnetic build-up layer 120 disposed proximate a lower surface 112 of the semiconductor package substrate 110, in accordance with at least one embodiment described herein. The semiconductor package substrate 110 includes a plurality of conductive pads 130 disposed on the lower surface 112 of the semiconductor package substrate 110 and a plurality of bump pads 140 disposed on the upper surface 114 of the semiconductor package substrate 110. A via 150 passes through the semiconductor package substrate 110, conductively coupling one of the plurality of conductive pads 130 to a respective one of the plurality of bump pads 140.

In embodiments, the semiconductor package substrate 110 may be disposed between a substrate 160 and a semiconductor die 170. A solder ball 162 or similar conductive device may conductively and physically couple the semiconductor package to the substrate 160. A solder bump 172 or similar conductive device may conductively and physically couple the semiconductor die 170 to the semiconductor package substrate 110. In some implementations, the conductive pad 130, the bump pad 140 and the via 150 provide a bidirectional communication pathway between the substrate 160 and the semiconductor die 170.

The semiconductor package substrate 110 may include a cored or coreless substrate having any number and/or combination of magnetic, dielectric, and/or conductive layers. In embodiments, the magnetic build-up layer 120 may be formed, patterned, applied, deposited or otherwise disposed to provide an anisotropic magnetic build-up layer 120. For example, an anisotropic magnetic build-up layer 120 may be formed by depositing the layer on the semiconductor package substrate 110 in the presence of an externally applied magnetic field. In embodiments, the magnetic build-up layer 120 may be formed, patterned, applied, deposited, or otherwise disposed to provide an isotropic magnetic build-up layer 120.

Magnetic permeability is a measure of the ability of a material to support the formation of a magnetic field within itself and is measured in units of henries/meter (H/m), materials having greater ability to provide a magnetic field have higher permeability values. The magnetic build-up layer 120 may include any number and/or combination of any currently available or future developed build-up materials capable of providing a magnetic build-up layer 120 having a magnetic permittivity of: about 5H/m or greater; about 7H/m or greater; about 9H/m or greater; about 11H/m or greater; or about 13H/m or greater. In embodiments, the permeability of the magnetic build-up layer 120 may be selected based upon providing a desired impedance matching inductance based on the capacitance of the conductive pads 130 and based on the impedance of the external circuitry to which the semiconductor package 110 is coupled.

In embodiments, the permeability of the magnetic build-up layer 120 may vary with operating frequency. Typically, the permeability of a material tends to decrease with increasing frequency. The permeability of the magnetic build-up layer 120 may decrease at operating frequencies of: greater than about 500 MHz; greater than about 1 GHz; greater than about 3 GHz; or greater than about 5 GHz.

In embodiments, the magnetic build-up layer 120 may be formed, patterned, applied, deposited, or otherwise disposed as an uncured magnetic slurry or paste that includes one or more magnetic materials, particles, nanoparticles, or similar nanostructures carried by or otherwise dispersed in a carrier matrix. An example magnetic slurry or magnetic paste is Ajinomoto 902PA magnetic build-up material. In embodiments, once applied to the semiconductor package substrate 110, the uncured magnetic slurry may be photo-cured; thermally-cured; or chemically-cured to provide the magnetic build-up layer 120. In embodiments, the magnetic build-up layer 120 may include a relatively rigid layer in the semiconductor package substrate 110. In other embodiments, the magnetic build-up layer 120 may include a relatively flexible layer in the semiconductor package substrate 110. The magnetic slurry may be formed, patterned, applied, deposited, or otherwise disposed across all or a portion of the surface of the semiconductor package substrate 110. The magnetic slurry may have a thickness of: greater than about 5 micrometers (μm) or more; greater than about 10 μm or more; greater than about 25 μm or more; greater than about 50 μm or more; greater than about 100 μm or more; or greater than about 200 μm or more. Each of the magnetic build-up layers 120 may have a thickness of: greater than about 5 micrometers (μm) or more; greater than about 10 μm or more; greater than about 25 μm or more; greater than about 50 μm or more; greater than about 100 μm or more; or greater than about 200 μm or more.

The magnetic slurry may be formed, patterned, applied, deposited, or otherwise disposed across all or a portion of the surface of the semiconductor package substrate 110 using any number and/or combination of currently available or future developed material deposition systems or methods. For example, the magnetic slurry may be printed on, across, or about the surface of at least a portion of the semiconductor package substrate 110. In another example, the magnetic slurry may be templated on, across, or about the surface of the semiconductor package substrate 110.

The at least one magnetic build-up layer 120 may be disposed proximate all or a portion of the plurality of conductive pads 130 formed, patterned, deposited, or otherwise disposed on the lower surface 112 of the semiconductor package substrate 110. The at least one magnetic build-up layer 120 may be disposed about all or a portion of the plurality of vias 150 disposed in the semiconductor package substrate 110. The at least one magnetic build-up layer 120 may be disposed at least partially about the perimeter of each of some or all of the plurality of conductive pads 130. The at least one magnetic build-up layer 120 may be disposed at least partially about the perimeter of each of some or all of the plurality of vias 150.

Each of the plurality of conductive pads 130 may be disposed in, on, about, or across all or a portion of the lower surface 112 of the semiconductor package substrate 110. Each of the plurality of conductive pads 130 may have the same or different physical geometry. For example, each of the plurality of conductive pads 130 may be generally circular. Each of the plurality of conductive pads 130 may have the same or a different diameter. Each of the plurality of conductive pads 130 may have a diameter of: about 1 millimeter (mm) or less; about 750 micrometers (μm) or less; about 500 μm or less; about 300 μm or less; or about 100 μm or less. Each of the plurality of conductive pads 130 may have the same or a different thickness. Each of the plurality of conductive pads 120 may have a thickness of: about 500 micrometers (μm) or less; about 300 μm or less; about 100 μm or less; or about 50 μm or less.

Each of the plurality of conductive pads 130 may be formed using an electrically conductive metal, an electrically conductive polymer, or an electrically conductive composite material (e.g., electrically conductive nanowires and/or nanoparticles in a carrier matrix). Each of the plurality of conductive pads 130 may be formed, patterned, deposited, or otherwise disposed in, on, across, or about all or a portion of the lower surface 112 of the semiconductor package substrate 110 using any number and/or combination of currently available and/or future developed systems or methods. Example methods include but are not limited to: printing, photolithography, electroplating, and electroless plating. In embodiments, at least some of the plurality of conductive pads 130 may be communicably and physically coupled to a substrate 160 using one or more conductive elements 162, such as a solder ball.

Each of the plurality of bump pads 140 may be disposed in, on, about, or across all or a portion of the upper surface 114 of the semiconductor package substrate 110. Each of the plurality of bump pads 140 may have any physical geometry. For example, each of the plurality of bump pads 140 may be generally circular. Each of the plurality of bump pads 140 may have the same or a different diameter. Each of the plurality of bump pads 140 may have a diameter of: about 500 micrometers (μm) or less; about 250 micrometers (μm) or less; about 100 μm or less; about 50 μm or less; or about 25 μm or less. Each of the plurality of bump pads 140 may have the same or a different thickness. Each of the plurality of bump pads 140 may have a thickness of: about 250 micrometers (μm) or less; about 100 μm or less; about 50 μm or less; or about 25 μm or less.

Each of the plurality of bump pads 140 may be formed using an electrically conductive metal, an electrically conductive polymer, or an electrically conductive composite material (e.g., electrically conductive nanowires and/or nanoparticles in a carrier matrix). Each of the plurality of bump pads 140 may be formed, patterned, deposited, or otherwise disposed in, on, across, or about all or a portion of the upper surface 114 of the semiconductor package substrate 110 using any number and/or combination of currently available and/or future developed systems or methods. Example methods include but are not limited to: printing, photolithography, electroplating, and electroless plating. In embodiments, at least some of the plurality of bump pads 140 may be communicably and physically coupled to a semiconductor die 170 using one or more conductive elements 172, such as a solder bump.

Each of a plurality of vias 150 conductively couples each of at least some of the plurality of bump pads 140 to a respective one of the conductive pads 130. At least some of the plurality of vias 150 may include microvias. In embodiments, each of the plurality of vias 150 may have a diameter of: about 300 micrometers (μm) or less; about 200 μm or less; about 150 μm or less; about 100 μm or less; or about 50 μm or less.

Figure 2:
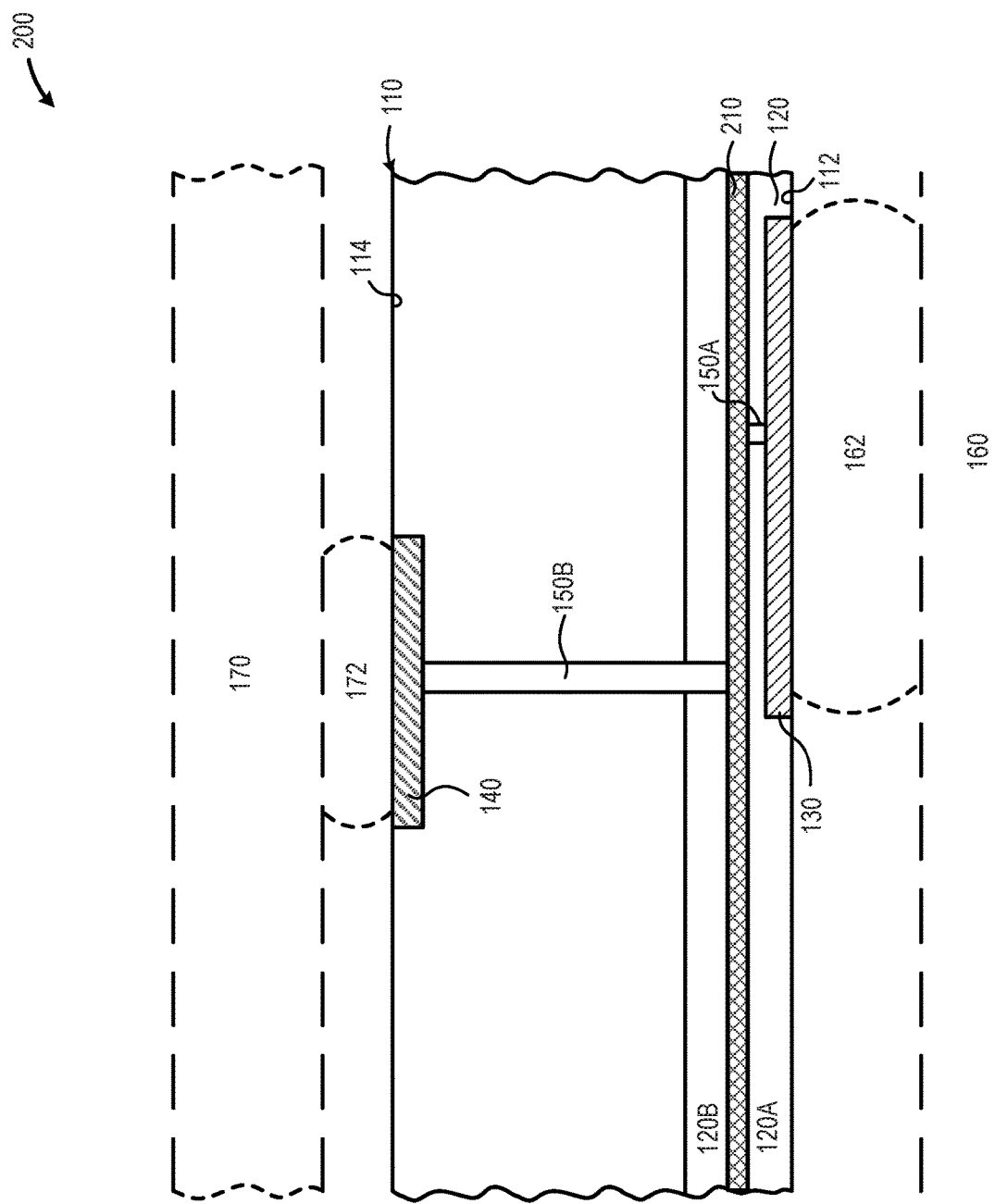
FIG. 2 is a partial cross-sectional elevation of an illustrative system that includes a multi-layer semiconductor package substrate that includes a conductive layer disposed between each of a plurality of magnetic build-up layers and, in accordance with at least one embodiment described herein.

FIG. 2 is a partial cross-sectional elevation of an illustrative system 200 that includes a multi-layer semiconductor package substrate 110 that includes a conductive layer disposed between each of a plurality of magnetic build-up layers 120A and 120B, in accordance with at least one embodiment described herein. In embodiments, the semiconductor package substrate 110 may include a plurality of layers. As depicted in FIG. 2, in embodiments, one or more conductive layers 210 may be interleaved between adjacent magnetic layers 120A and 120B. Although only a single conductive layer 210 and two magnetic build-up layers 120 are depicted in FIG. 2, any number of conductive layers 210A-210$n$ and any number of magnetic build-up layers 120A-120$n$ may be similarly interleaved. A staggered via that includes two segments 150A and 150B may conductively couple the conductive pad 130 to a bump pad 140. In such embodiments, the conductive layer 210 may conductively couple the segments 150A and 150B forming the staggered via.

The conductive layer 210 may be formed, patterned, deposited, or otherwise disposed in, on, across, or about the semiconductor package substrate 110 using any number and/or combination of currently available and/or future developed material deposition systems or methods. For example, the conductive layer may be photolithographically deposited on the surface of the semiconductor package substrate 110.

Figure 3A:
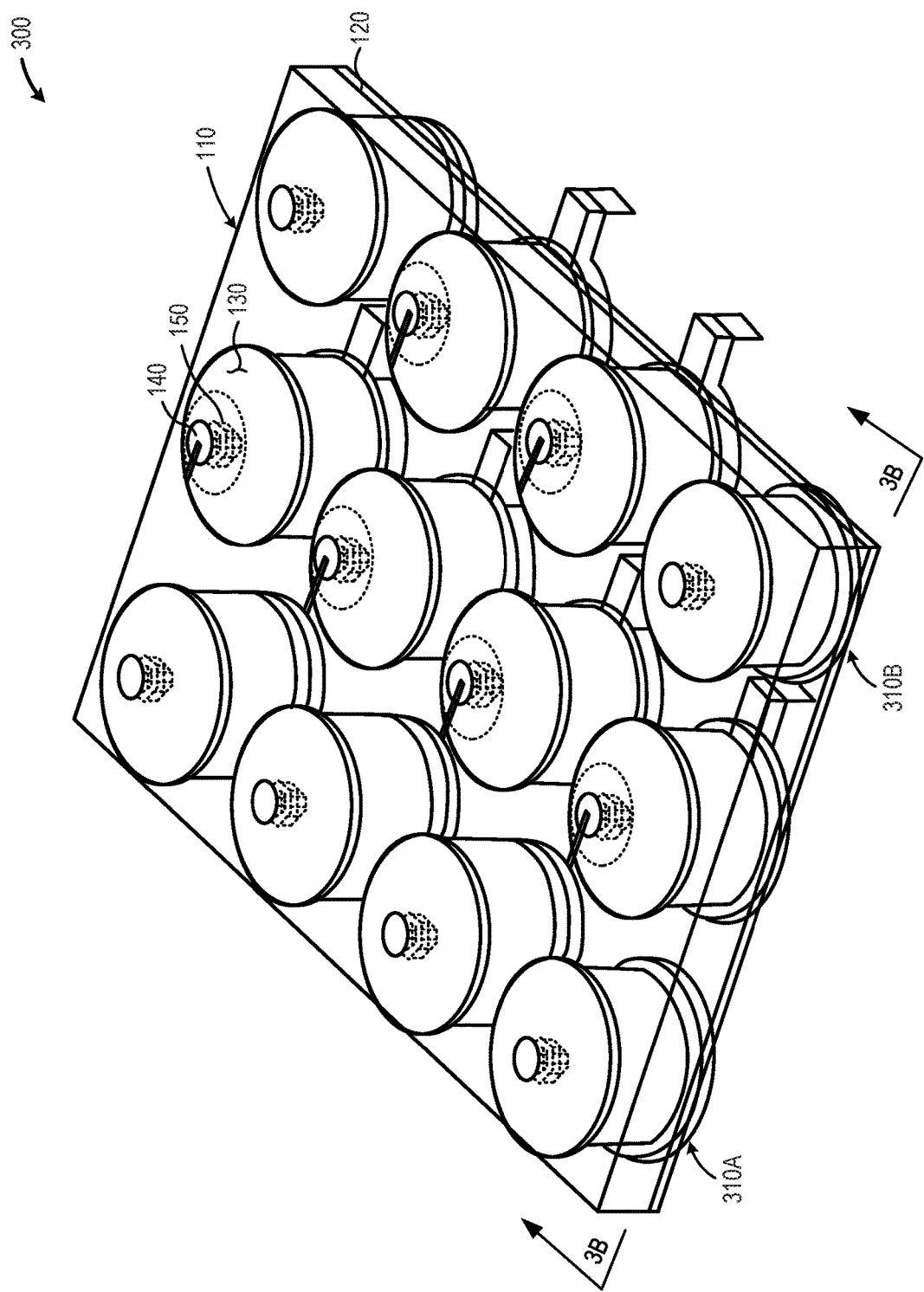
FIG. 3A is a perspective view of an illustrative system that includes a semiconductor package substrate that includes one or more magnetic layers disposed about a plurality of conductive pads, a plurality of bump pads, and the plurality of vias that conductively couple the conductive pads to the bump pads, in accordance with at least one embodiment described herein.
Figure 3B:
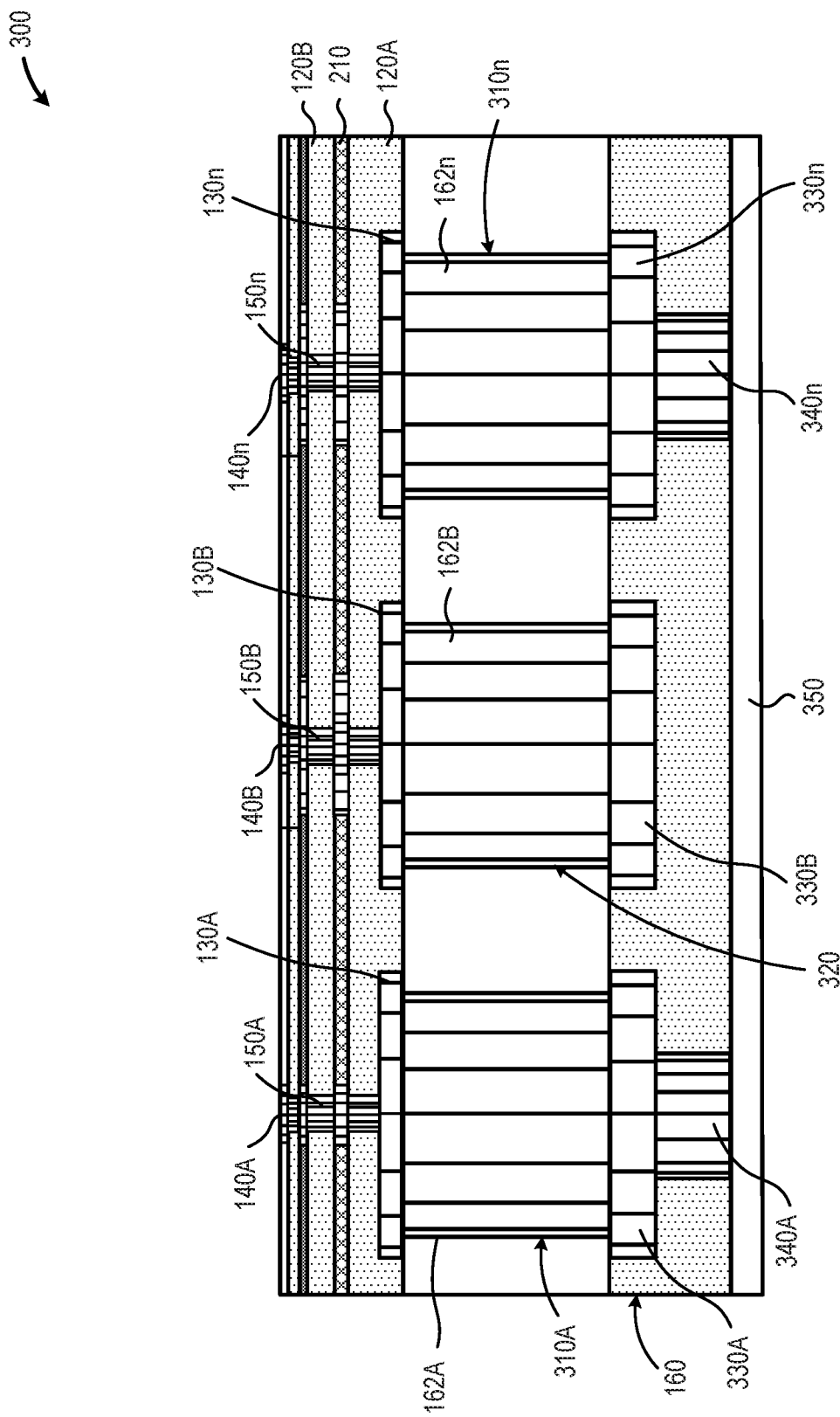
FIG. 3B is a cross-sectional view of the illustrative system depicted in FIG. 3A along section line 3B-3B, in accordance with at least one embodiment described herein.

FIG. 3A is a perspective view of an illustrative system 300 that includes a semiconductor package substrate 110 that includes one or more magnetic layers 120 disposed about a plurality of conductive pads 130, a plurality of bump pads 140, and the plurality of vias 150 that conductively couple the conductive pads 130 to the bump pads 140, in accordance with at least one embodiment described herein. FIG. 3B is a cross-sectional view of the illustrative system depicted in FIG. 3A along section line 3B-3B, in accordance with at least one embodiment described herein. As depicted in FIGS. 3A and 3B, the semiconductor package substrate 110 may include a first plurality of conductive pads 130, a first plurality of bump pads 140, and a corresponding first plurality of vias 150 forming grounding circuits 310A-310F (collectively, "grounding circuits 310") used to ground the semiconductor die 160 to a ground plane 350 in the system substrate 110. Further, as depicted in FIGS. 3A and 3B, the semiconductor package substrate 110 may include a second plurality of conductive pads 130, a second plurality of bump pads 140, and a corresponding second plurality of vias 150 forming communication circuits 320A-320F (collectively, "communication circuits 320") used to provide high bandwidth communication between the semiconductor package 160 and the system substrate 170.

Referring now to FIG. 3B, each of the grounding circuits 310 includes, in addition to the respective conductive pad 130, bump pad 140 and via 150, a conductive structure 162 that conductively and physically couples the conductive pad 130 disposed on the lower surface 112 of the semiconductor package substrate 110 to a respective conductive land 330 disposed on the upper surface of the system substrate 160. The conductive structure 162 may include any electrically conductive element capable of physically and conductively coupling the semiconductor package substrate 110 to the system substrate 160. A non-limiting example of a conductive structure includes a solder ball or similar device. Within the system substrate 160, vias 340A-340$n$ conductively couple each of the grounding circuits 310A-310$n$ to the ground plane 350 in the system substrate 160.

Each of the communication circuits 320 includes, in addition to the respective conductive pad 130, bump pad 140 and via 150, a conductive structure 162 that conductively and physically couples the conductive pad 130 disposed on the lower surface 112 of the semiconductor package substrate 110 to a respective conductive land 330 disposed on the upper surface of the system substrate 160. A non-limiting example of a conductive structure 162 includes a solder ball or similar device. Within the system substrate 160, circuitry (vias, traces, etc.) may conductively couple the semiconductor die 170 to one or more external devices, systems, and/or components.

Figure 4:
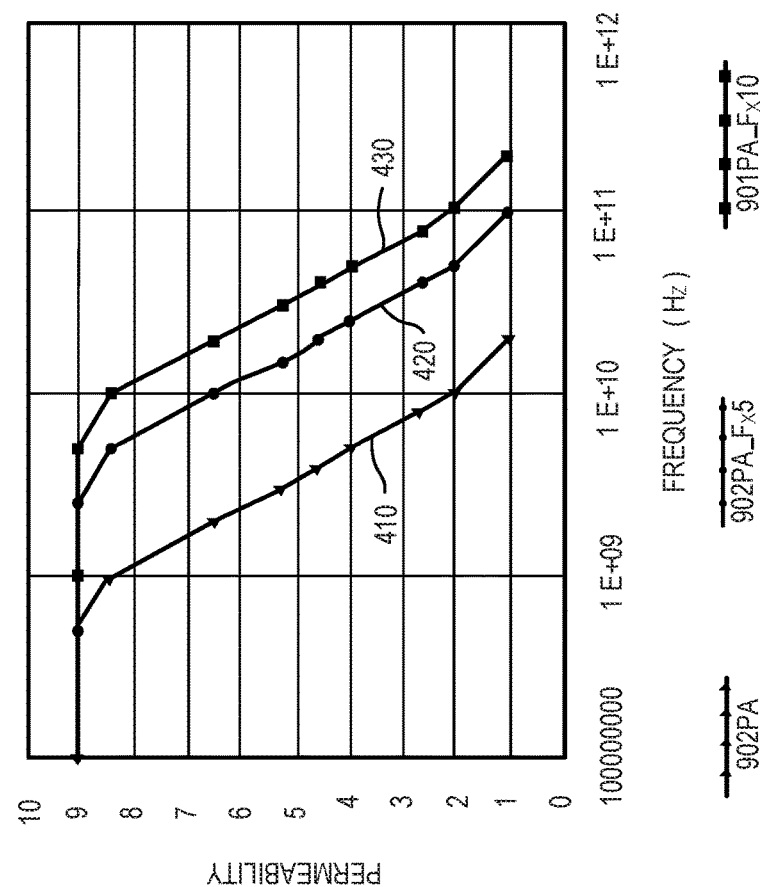
FIG. 4 is a graph depicting the permeability roll-off (in H/m) as a function of frequency (in Hz) for an illustrative magnetic material useful for forming magnetic layers in a semiconductor package substrate, in accordance with at least one embodiment described herein.

FIG. 4 is a graph 400 depicting the permeability roll-off (in H/m) as a function of frequency (in Hz) for an illustrative magnetic material useful for forming magnetic layers 120 in a semiconductor package substrate 110, in accordance with at least one embodiment described herein. Curve 410 depicts the permeability of the magnetic material as a function of operating frequency. As depicted in FIG. 4, the magnetic material maintains a relatively constant permeability value of to operating frequencies up to 900 MHz. Above 1 GHz, the permeability of the magnetic material decreases. Curve 420 depicts the permeability of a first hypothetical magnetic material (the original magnetic material used in curve 410, scaled by a factor of 5) scaled by a factor of 5. Curve 430 depicts the permeability of a second hypothetical magnetic material (the original magnetic material used in curve 410, scaled by a factor of 10).

Figure 5:
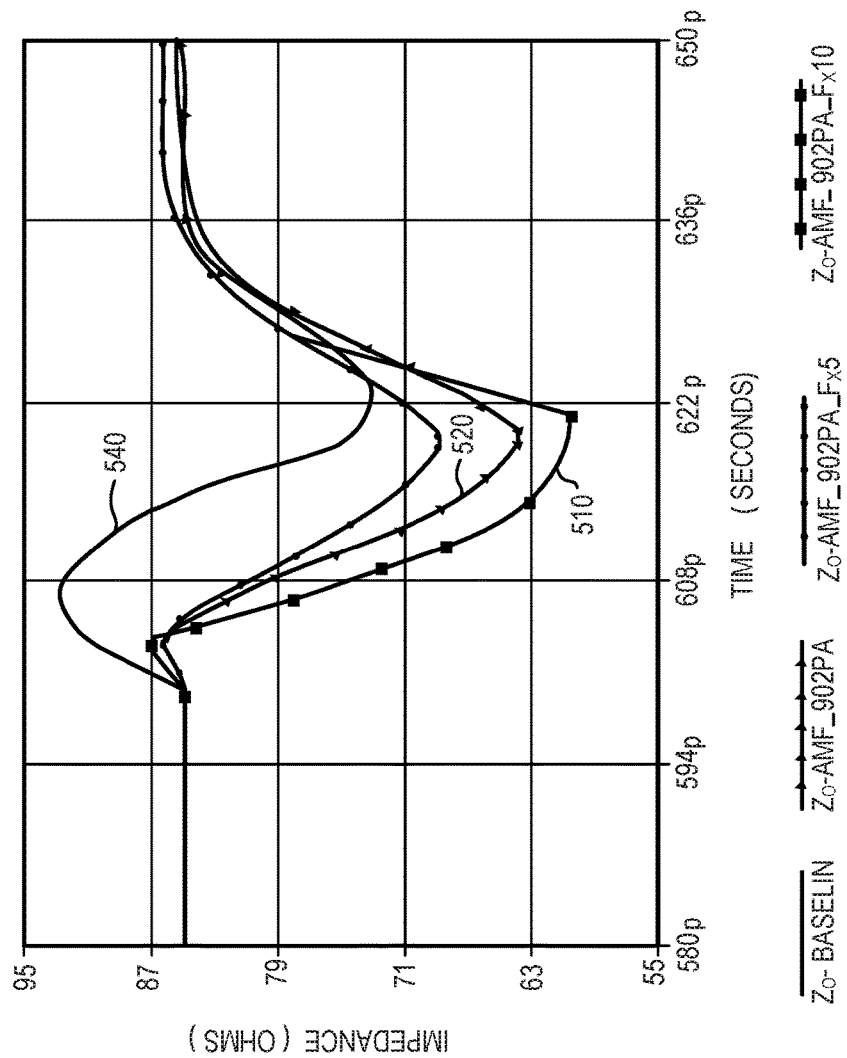
FIG. 5 is a graph depicting the time domain reflectometry (TDR) impedance (in Ohms, $\Omega$) provided by the magnetic layer as a function of time (in picoseconds, ps) with an 85$\Omega$ reference impedance and a 15 ps rise time, in accordance with at least one embodiment described herein.

FIG. 5 is a graph 500 depicting the time domain reflectometry (TDR) impedance (in Ohms, Ω) provided by the magnetic layer 120 as a function of time (in picoseconds, ps) with an 85Ω reference impedance and a 15 ps rise time, in accordance with at least one embodiment described herein. Curve 510 depicts the impedance of a reference, non-magnetic, build-up layer. Using the non-magnetic build-up layer, the impedance drops to approximately 59Ω. Curve 520 depicts the impedance of a system using the same magnetic material used in developing FIG. 4 as a build-up material. Using a magnetic build-up layer increases the impedance to about 64Ω, an 8-10% improvement that beneficially contributes to impedance matching within the system. Curve 530 depicts the impedance of a system using a first hypothetical magnetic material (the original magnetic material used in curve 520, with roll-off frequency scaled by a factor of 5). Using the first hypothetical magnetic material the impedance may be increased to about 69Ω, a 15-20% improvement. Curve 540 depicts the impedance of a system using a second hypothetical magnetic material (the original magnetic material used in curve 520, with roll-off frequency scaled by a factor of 10). The second hypothetical magnetic material is too inductive and overcompensates for the capacitance of the conductive pad 130.

Figure 6:
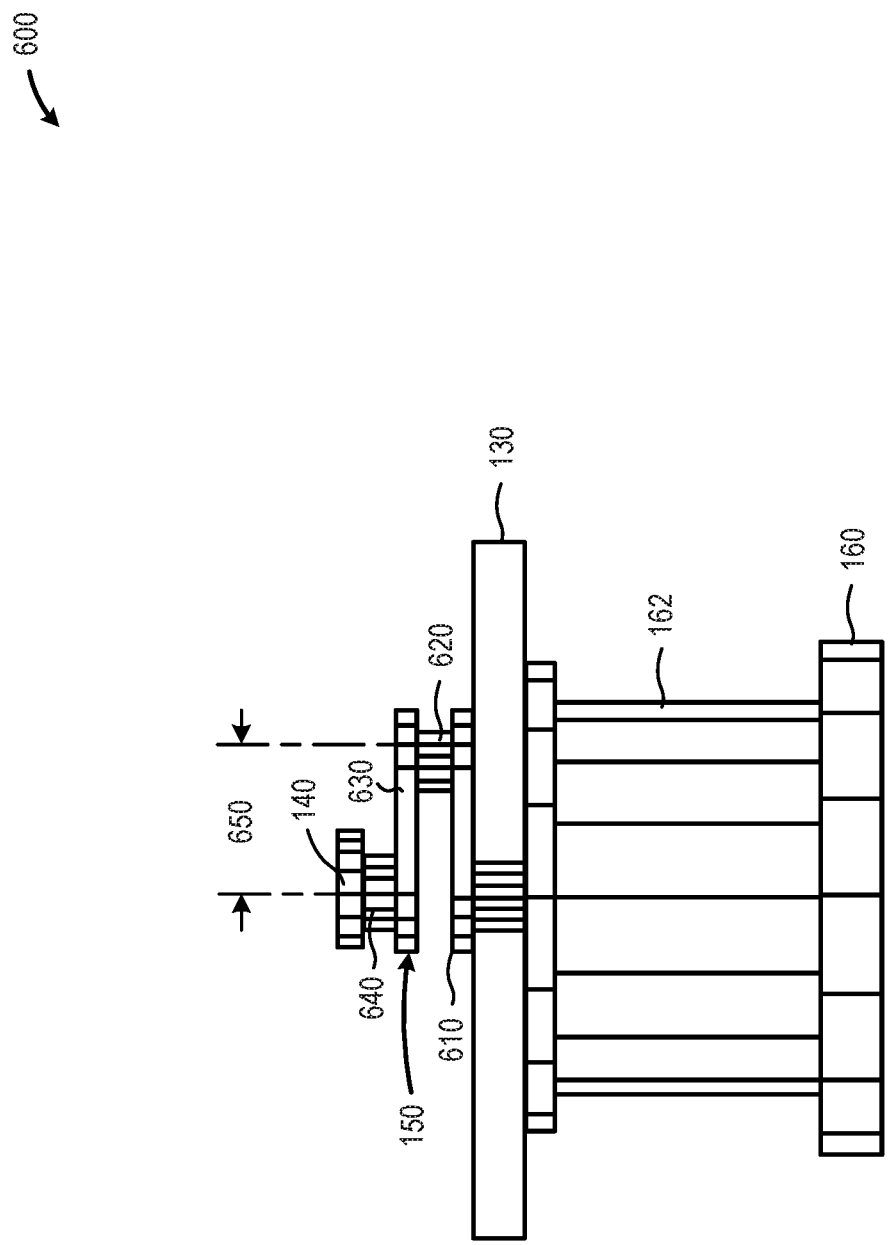
FIG. 6 is an elevation of an illustrative system that includes a staggered via that includes a first conductive trace, a first via portion, a second conductive trace, and a second via portion 640, in accordance with at least one embodiment described herein.

FIG. 6 is an elevation of an illustrative system 600 that includes a staggered via 150 that includes a first conductive trace 610, a first via portion 620, a second conductive trace 630, and a second via portion 640, in accordance with at least one embodiment described herein. The semiconductor package substrate 110 may include a plurality of vias 150A-150$n$, with a first portion including stacked (i.e., "straight") vias that vertically penetrate the semiconductor package substrate 110 and a second portion including staggered vias that use a combination of via portions and conductive traces to conductively couple one of the conductive pads 130 with one of the bump pads 140. In embodiments, the conductive traces may include conductive layers formed in a multi-layer semiconductor package substrate 110. Adjacent via portions, such as the first via portion 620 and the second via portion 640 may be offset by an offset distance 650. In embodiments, the offset distance 650 may be: about 300 micrometers (μm) or less; about 200 μm or less; about 100 μm or less; about 50 μm or less; or about 25 μm or less.

Figure 7:
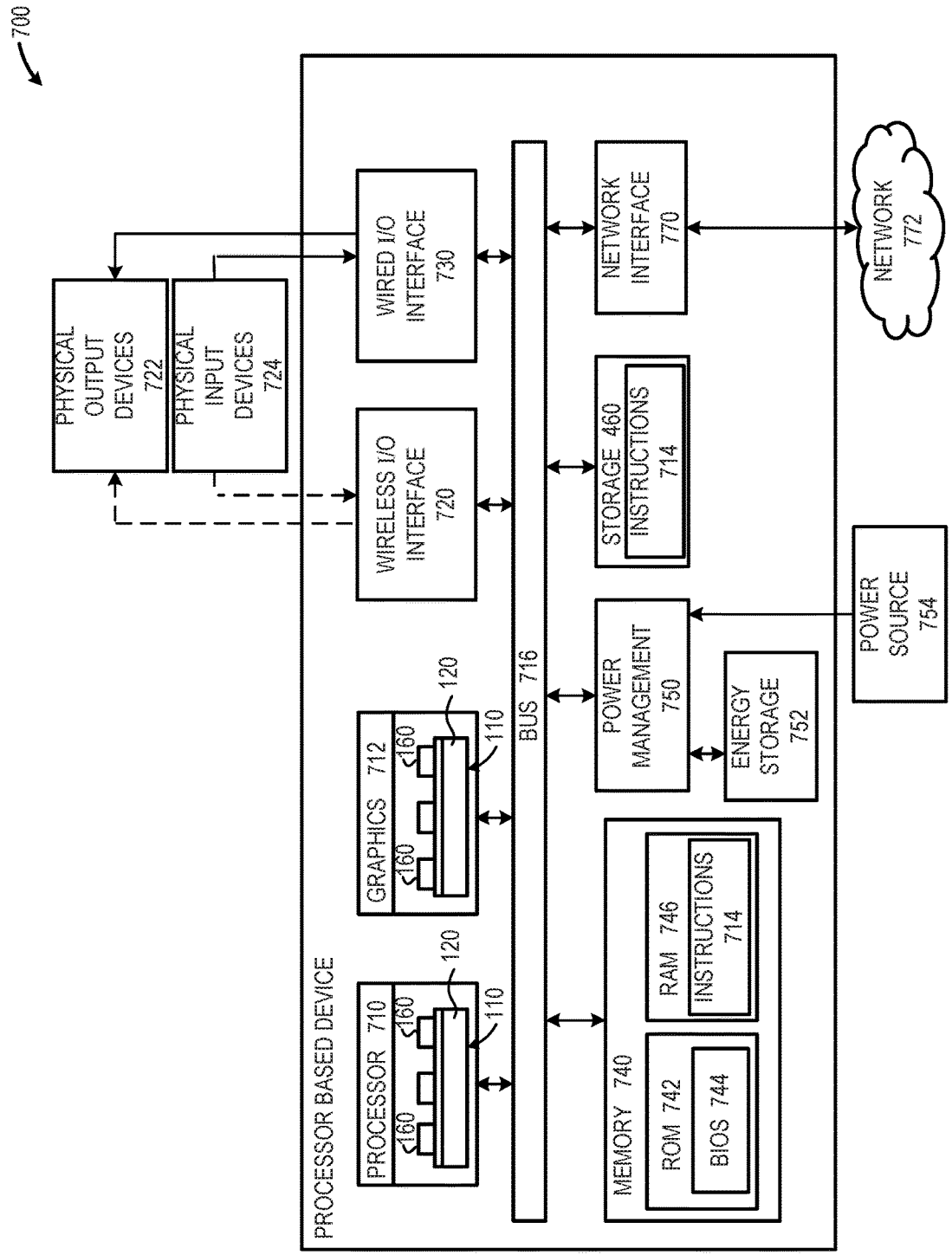
FIG. 7 is a schematic diagram of an illustrative processor-based device that includes one or more processors that include one or more semiconductor dies coupled to a semiconductor package substrate that includes one or more magnetic build-up layers disposed about conductive pads used to couple the semiconductor package substrate to a system substrate, such as a device motherboard, in accordance with at least one embodiment described herein.

FIG. 7 is a schematic diagram of an illustrative processor-based device 700 that includes one or more processors 710 that include one or more semiconductor dies 160 coupled to a semiconductor package substrate 110 that includes one or more magnetic build-up layers 120 disposed about conductive pads 130 used to couple the semiconductor package substrate 110 to a system substrate 160, such as a device motherboard, in accordance with at least one embodiment described herein. The processor-based device 700 may include one or more: processor circuits 710, graphics processor circuits 712, wireless input/output (I/O) interfaces 720, wired I/O interfaces 730, memory circuits 740, power management circuits 750, storage devices 760, and/or network interfaces 770. The following discussion provides a brief, general description of the components forming the illustrative processor-based device 700. Example, non-limiting processor-based devices 700 may include: smartphones, wearable computers, portable computing devices, handheld computing devices, desktop computing devices, blade server devices, workstations, and similar.

The processor-based device 700 includes processor circuitry 710 having a semiconductor package substrate 110 that includes one or more magnetic build-up layers 120 disposed proximate the conductive pads 130 used to couple semiconductor die(s) forming at least a portion of the processor circuitry 710 to a system substrate 160, such as a motherboard. In embodiments, the processor-based device 700 may additionally include graphics processor circuitry 712 having a semiconductor package substrate 110 that includes one or more magnetic build-up layers 120 disposed proximate the conductive pads 130 used to couple semiconductor die(s) forming at least a portion of the graphics processor circuitry 712 to a system substrate 160, such as the motherboard. In embodiments, the processor-based device 700 includes processor circuitry 710 capable of executing machine-readable instruction sets 714, reading data and/or instructions 714 from one or more storage devices 760 and writing data to the one or more storage devices 760. In some embodiments, the processor-based device 700 includes graphics processor circuitry 712 capable of executing machine-readable instruction sets 714 and generating an output signal capable of providing a display output to a system user. Those skilled in the relevant art will appreciate that the illustrated embodiments as well as other embodiments may be practiced with other processor-based device configurations, including portable electronic or handheld electronic devices, for instance smartphones, portable computers, wearable computers, consumer electronics, personal computers ("PCs"), network PCs, minicomputers, server blades, mainframe computers, and the like.

The processor circuitry 710 may include any number of hardwired or configurable circuits, some or all of which may include programmable and/or configurable combinations of electronic components, semiconductor devices, and/or logic elements that are disposed partially or wholly in a PC, server, or other computing system capable of executing processor-readable instructions.

The processor-based device 700 includes a bus or similar communications link 716 that communicably couples and facilitates the exchange of information and/or data between various system components including the processor circuitry 710, the graphics processor circuitry 712, one or more wireless I/O interfaces 720, one or more wired I/O interfaces 730, one or more storage devices 760, and/or one or more network interfaces 770. The processor-based device 700 may be referred to in the singular herein, but this is not intended to limit the embodiments to a single processor-based device 700, since in certain embodiments, there may be more than one processor-based device 700 that incorporates, includes, or contains any number of communicably coupled, collocated, or remote networked circuits or devices.

The processor circuitry 710 may include one or more semiconductor packages that include one or more semiconductor dies 160A-160n coupled to a semiconductor package substrate 110 that includes one or more magnetic build-up layers 120 disposed proximate the conductive pads 130 used to couple the one or more semiconductor packages to a system substrate 160, such as a motherboard or server blade. The graphics processor circuitry 712 may include one or more semiconductor packages that include one or more semiconductor dies 160A-160n coupled to a semiconductor package substrate 110 that includes one or more magnetic build-up layers 120 disposed proximate the conductive pads 130 used to couple the one or more semiconductor packages to a system substrate 160, such as a motherboard or server blade.

The processor circuitry 710 may include any number, type, or combination of currently available or future developed devices capable of executing machine-readable instruction sets. The processor circuitry 710 may include but is not limited to any current or future developed single- or multi-core processor or microprocessor, such as: on or more systems on a chip (SOCs); central processing units (CPUs); digital signal processors (DSPs); graphics processing units (GPUs); application-specific integrated circuits (ASICs), programmable logic units, field programmable gate arrays (FPGAs), and the like. Unless described otherwise, the construction and operation of the various blocks shown in FIG. 7 are of conventional design. Consequently, such blocks need not be described in further detail herein, as they will be understood by those skilled in the relevant art. The bus 716 that interconnects at least some of the components of the processor-based device 700 may employ any currently available or future developed serial or parallel bus structures or architectures.

The system memory 740 may include read-only memory ("ROM") 742 and random access memory ("RAM") 746. A portion of the ROM 742 may be used to store or otherwise retain a basic input/output system ("BIOS") 744. The BIOS 744 provides basic functionality to the processor-based device 700, for example by causing the processor circuitry 710 to load and/or execute one or more machine-readable instruction sets 714. In embodiments, at least some of the one or more machine-readable instruction sets 714 cause at least a portion of the processor circuitry 710 to provide, create, produce, transition, and/or function as a dedicated, specific, and particular machine, for example a word processing machine, a digital image acquisition machine, a media playing machine, a gaming system, a communications device, a smartphone, or similar.

The processor-based device 700 may include at least one wireless input/output (UO) interface 720. The at least one wireless I/O interface 720 may be communicably coupled to one or more physical output devices 722 (tactile devices, video displays, audio output devices, hardcopy output devices, etc.). The at least one wireless I/O interface 720 may communicably couple to one or more physical input devices 724 (pointing devices, touchscreens, keyboards, tactile devices, etc.). The at least one wireless I/O interface 720 may include any currently available or future developed wireless I/O interface. Example wireless I/O interfaces include, but are not limited to: BLUETOOTH®, near field communication (NFC), and similar.

The processor-based device 700 may include one or more wired input/output (I/O) interfaces 730. The at least one wired I/O interface 730 may be communicably coupled to one or more physical output devices 722 (tactile devices, video displays, audio output devices, hardcopy output devices, etc.). The at least one wired I/O interface 730 may be communicably coupled to one or more physical input devices 724 (pointing devices, touchscreens, keyboards, tactile devices, etc.). The wired I/O interface 730 may include any currently available or future developed I/O interface. Example wired I/O interfaces include, but are not limited to: universal serial bus (USB), IEEE 1394 ("FireWire"), and similar.

The processor-based device 700 may include one or more communicably coupled, non-transitory, data storage devices 760. The data storage devices 760 may include one or more hard disk drives (HDDs) and/or one or more solid-state storage devices (SSDs). The one or more data storage devices 760 may include any current or future developed storage appliances, network storage devices, and/or systems. Non-limiting examples of such data storage devices 460 may include, but are not limited to, any current or future developed non-transitory storage appliances or devices, such as one or more magnetic storage devices, one or more optical storage devices, one or more electro-resistive storage devices, one or more molecular storage devices, one or more quantum storage devices, or various combinations thereof. In some implementations, the one or more data storage devices 760 may include one or more removable storage devices, such as one or more flash drives, flash memories, flash storage units, or similar appliances or devices capable of communicable coupling to and decoupling from the processor-based device 700.

The one or more data storage devices 760 may include interfaces or controllers (not shown) communicatively coupling the respective storage device or system to the bus 716. The one or more data storage devices 460 may store, retain, or otherwise contain machine-readable instruction sets, data structures, program modules, data stores, databases, logical structures, and/or other data useful to the processor circuitry 710 and/or graphics processor circuitry 712 and/or one or more applications executed on or by the processor circuitry 710 and/or graphics processor circuitry 712. In some instances, one or more data storage devices 760 may be communicably coupled to the processor circuitry 710, for example via the bus 716 or via one or more wired communications interfaces 730 (e.g., Universal Serial Bus or USB); one or more wireless communications interfaces 720 (e.g., Bluetooth®, Near Field Communication or NFC); and/or one or more network interfaces 770 (IEEE 802.3 or Ethernet, IEEE 802.11, or WiFi®, etc.).

Processor-readable instruction sets 714 and other programs, applications, logic sets, and/or modules may be stored in whole or in part in the system memory 740. Such instruction sets 714 may be transferred, in whole or in part, from the one or more data storage devices 760. The instruction sets 714 may be loaded, stored, or otherwise retained in system memory 740, in whole or in part, during execution by the processor circuitry 710 and/or graphics processor circuitry 712. The processor-readable instruction sets 714 may include machine-readable and/or processor-readable code, instructions, or similar logic capable of providing the speech coaching functions and capabilities described herein.

The processor-based device 700 may include power management circuitry 750 that controls one or more operational aspects of the energy storage device 752. In embodiments, the energy storage device 752 may include one or more primary (i.e., non-rechargeable) or secondary (i.e., rechargeable) batteries or similar energy storage devices. In embodiments, the energy storage device 752 may include one or more supercapacitors or ultracapacitors. In embodiments, the power management circuitry 750 may alter, adjust, or control the flow of energy from an external power source 754 to the energy storage device 752 and/or to the processor-based device 700. The power source 754 may include, but is not limited to, a solar power system, a commercial electric grid, a portable generator, an external energy storage device, or any combination thereof.

For convenience, the processor circuitry 710, the graphics processor circuitry 712, the wireless I/O interface 720, the wired I/O interface 730, the power management circuitry 750, the storage device 760, and the network interface 770 are illustrated as communicatively coupled to each other via the bus 716, thereby providing connectivity between the above-described components. In alternative embodiments, the above-described components may be communicatively coupled in a different manner than illustrated in FIG. 7. For example, one or more of the above-described components may be directly coupled to other components, or may be coupled to each other, via one or more intermediary components (not shown). In another example, one or more of the above-described components may be integrated into the processor circuitry 410 and/or the graphics processor circuitry 712. In some embodiments, all or a portion of the bus 716 may be omitted and the components are coupled directly to each other using suitable wired or wireless connections.

Figure 8:
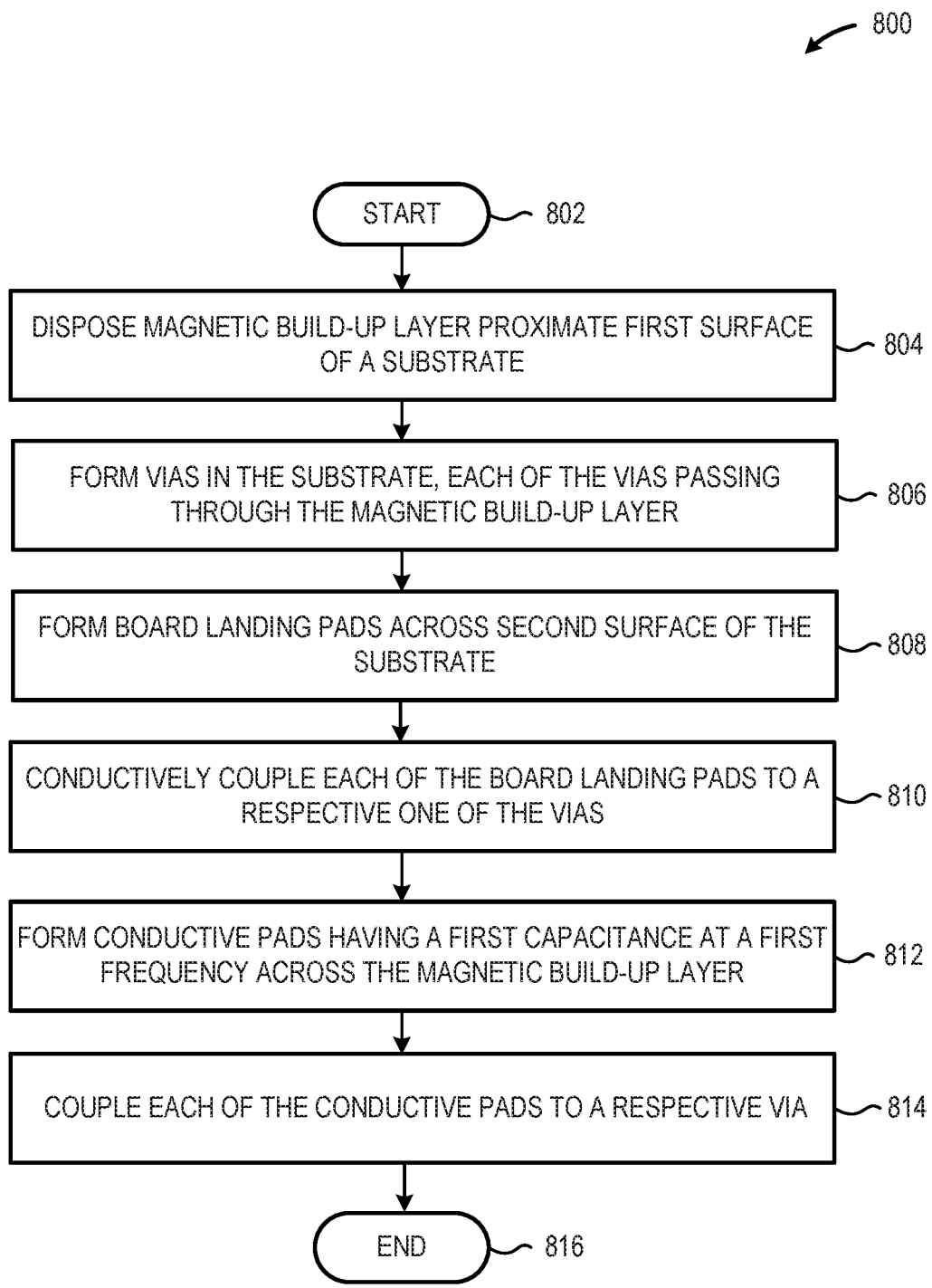
FIG. 8 is a flow diagram of an illustrative method for fabricating a semiconductor package substrate that includes one or more magnetic material build-up layers disposed proximate at least a portion of the conductive pads disposed on the lower surface of the semiconductor package substrate, in accordance with at least one embodiment described herein.

FIG. 8 is a flow diagram of an illustrative method 800 for fabricating a semiconductor package substrate 110 that includes one or more magnetic material build-up layers 120 disposed proximate at least a portion of the conductive pads 130 disposed on the lower surface 112 of the semiconductor package substrate 110, in accordance with at least one embodiment described herein. The use of a magnetic build-up layer 120 proximate a conductive pad 130 compensates for the capacitance of the relatively large conductive pad 130 disposed on the lower surface 112 of the semiconductor package substrate 110. The method 800 commences at 802.

At 804, a magnetic build-up layer 120 is disposed proximate a lower surface 112 of a semiconductor package substrate 110. The magnetic build-up layer 120 may be formed, patterned, deposited, or disposed on, about or across at least a portion of the lower surface of the semiconductor package substrate 110 using any currently available or future developed material deposition method or system. The magnetic build-up layer 120 may include a single magnetic build-up layer 120 or may include a plurality of magnetic build-up layers 120A-120$n$ having one or more interleaved conductive layers 210A-210$n$. The magnetic material used to form the magnetic build-up layer may include one or more magnetic materials disposed in and/or carried by a curable carrier matrix. Each magnetic build-up layer 120A-120$n$ may have a thickness of: greater than about 5 micrometers (μm) or more; greater than about 10 μm or more; greater than about 25 µm or more; greater than about 50 µm or more; greater than about 100 µm or more; or greater than about 200 µm or more.

At 806, one or more vias 150 are formed through the semiconductor package substrate 110. The one or more vias 150 may include one or more stacked vias. The one or more vias 150 may include one or more staggered vias that include a plurality of non-vertically aligned via portions connected using conductive traces or similar conductive elements formed in the semiconductor package substrate 110. At least some of the vias 150 pass through the magnetic build-up layer 120. In embodiments, the one or more vias may include one or more microvias.

At 808, a plurality of bump pads 140 are formed, patterned, deposited or otherwise disposed in, on, about, or across at least a portion of the upper surface 114 of the semiconductor package substrate 110. A semiconductor die 170 may conductively couple to the bump pads 140 using one or more conductive structures 172, such as solder bumps. The bump pads 140 may be formed, patterned, deposited, or otherwise applied to the upper surface 114 of the semiconductor package substrate 110 using any currently available and/or future developed material deposition systems or methods. Example material deposition systems include but are not limited to: photolithography, electroplating, electro-less plating, conductive ink printing, and similar. Each of the plurality of bump pads 140 may have any physical geometry. For example, each of the plurality of bump pads 140 may be generally circular. Each of the plurality of bump pads 140 may have the same or a different diameter. Each of the plurality of bump pads 140 may have a diameter of: about 500 micrometers (µm) or less; about 250 micrometers (µm) or less; about 100 µm or less; about 50 µm or less; or about 25 µm or less. Each of the plurality of bump pads 140 may have the same or a different thickness. Each of the plurality of bump pads 140 may have a thickness of: about 250 micrometers (µm) or less; about 100 µm or less; about 50 µm or less; or about 25 µm or less.

At 810, each of at least some of the plurality of bump pads 140 is conductively coupled to a respective one of the plurality of vias 150 formed through the semiconductor package substrate 110.

At 812 a plurality of conductive pads 130 are formed, patterned, deposited or otherwise disposed in, on, about, or across at least a portion of the lower surface 112 of the semiconductor package substrate 110. A system substrate 160 may conductively couple to some or all of the conductive pads 130 using one or more conductive structures 162, such as solder balls. The conductive pads 130 may be formed, patterned, deposited, or otherwise disposed in, on, across, or about all or a portion of the lower surface 112 of the semiconductor package substrate 110 using any currently available and/or future developed material deposition systems or methods. Example material deposition systems include but are not limited to: photolithography, electroplating, electro-less plating, conductive ink printing, and similar. Each of the plurality of conductive pads 130 may have any physical geometry. For example, each of the plurality of conductive pads 130 may be generally circular. Each of the plurality of conductive pads 130 may have the same or a different diameter. Each of the plurality of conductive pads 130 may have a diameter of: about 1 millimeter (mm) or less; about 750 micrometers (µm) or less; about 500 µm or less; about 300 µm or less; or about 100 µm or less. Each of the plurality of conductive pads 130 may have the same or a different thickness. Each of the plurality of conductive pads 120 may have a thickness of: about 500 micrometers (µm) or less; about 300 µm or less; about 100 µm or less; or about 50 µm or less.

At 814, each of at least some of the plurality of conductive pads 130 is conductively coupled to a respective one of the plurality of vias 150 formed through the semiconductor package substrate 110. The method 800 concludes at 816.

While FIG. 8 illustrates various operations according to one or more embodiments, it is to be understood that not all of the operations depicted in FIG. 8 are necessary for other embodiments. Indeed, it is fully contemplated herein that in other embodiments of the present disclosure, the operations depicted in FIG. 8, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure. As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

As used in any embodiment herein, the terms "system" or "module" may refer to, for example, software, firmware and/or circuitry configured to perform any of the aforementioned operations. Software may be embodied as a software package, code, instructions, instruction sets and/or data recorded on non-transitory computer readable storage mediums. Firmware may be embodied as code, instructions or instruction sets and/or data that are hard-coded (e.g., non-volatile) in memory devices. "Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry or future computing paradigms including, for example, massive parallelism, analog or quantum computing, hardware embodiments of accelerators such as neural net processors and non-silicon implementations of the above. The circuitry may, collectively or individually, be embodied as circuitry that forms part of a larger system, for example, an integrated circuit (IC), system on-chip (SoC), desktop computers, laptop computers, tablet computers, servers, smartphones, etc.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software executed by a programmable control device.

Thus, the present disclosure is directed to systems and methods for improving the impedance matching of semiconductor package substrates by incorporating one or more magnetic build-up layers proximate relatively large diameter, relatively high capacitance, conductive pads formed on the lower surface of the semiconductor package substrate. The one or more magnetic layers may be formed using a magnetic build-up material deposited on the lower surface of the semiconductor package substrate. Vias conductively coupling the conductive pads to bump pads on the upper surface of the semiconductor package substrate pass through the magnetic build-up material.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for forming magnetically lined through-holes in a semiconductor package substrate.

According to example 1, there is provided a semiconductor interconnect. The semiconductor interconnect may include: a substrate having a first surface and a transversely opposed second surface; at least one magnetic build-up layer disposed proximate the first surface of the substrate; a plurality of bump pads disposed across at least a portion of the second surface of the substrate; a plurality of conductive ball pads having a first capacitance at a first frequency disposed across at least a portion of the surface of the substrate, each of at least some of the plurality of conductive ball pads disposed proximate the at least one magnetic build-up layer; and a plurality of conductive vias, each of the plurality of vias conductively coupling at least one of the plurality of bump pads to a respective one of the plurality of conductive ball pads, the at least one magnetic build-up layer disposed about at least a portion of an external perimeter of each of at least some of the plurality of conductive vias.

Example 2 may include elements of example 1 where the at least one magnetic build-up layer comprises a plurality of magnetic build-up layers.

Example 3 may include elements of example 1 or 2 and the semiconductor interconnect may additionally include a metal layer disposed between two of the plurality of magnetic build-up layers.

Example 4 may include elements of any of examples 1 through 3 where at least a portion of the conductive vias include staggered vias conductively coupled by the metal layer.

Example 5 may include elements of any of examples 1 through 4 where the staggered via comprises a first portion and a second portion offset by a distance from the first portion.

Example 6 may include elements of any of examples 1 through 5 where the distance between the first portion of the staggered via and the second portion of the staggered via is selected based upon a desired inductance value.

Example 7 may include elements of any of examples 1 through 6 where the distance between the first portion of the staggered via and the second portion of the staggered via comprises a distance of 100 micrometers (μm) or less.

Example 8 may include elements of any of examples 1 through 7 where the at least one magnetic build-up layer comprises a magnetic build-up layer having a permeability of from about 5 to about 10 at frequencies of 5 GHz or less.

According to example 9, there is provided a semiconductor interconnect fabrication method. The method may include: disposing at least one magnetic build-up layer proximate at least a portion of a first surface of a substrate; forming a plurality of vias in the substrate, each of at least some of the plurality of vias passing through the at least one magnetic build-up layer such that the at least one magnetic build-up layer is disposed about at least a portion of an external perimeter of the respective via; forming a plurality of bump pads across at least a portion of a second surface of the substrate, the second surface transversely opposed across a thickness of the substrate to the first surface, conductively coupling each of at least a portion of the plurality of bump pads to a respective one of the plurality of vias; forming a plurality of conductive ball pads across at least a portion of the first surface of the substrate, each of at least a portion of the plurality of conductive ball pads disposed proximate the at least one magnetic build-up layer, each of the conductive ball pads having a first capacitance at a first frequency; and conductively coupling each of at least a portion of the plurality of conductive ball pads to a respective one of the plurality of vias.

Example 10 may include elements of example 9 where disposing at least one magnetic build-up layer proximate at least a portion of a first surface of a substrate may include: disposing a plurality of magnetic build-up layers proximate at least a portion of the first surface of the substrate.

Example 11 may include elements of any of examples 9 or 10 and the method may additionally include: disposing a metal layer between two of the plurality of magnetic build-up layers.

Example 12 may include elements of any of examples 9 through 11 where forming a plurality of vias in the substrate may include: forming at least one staggered via conductively coupled by the metal layer.

Example 13 may include elements of any of examples 9 through 12 where forming at least one staggered via conductively coupled by the metal layer may include: forming the staggered via in which a first portion of the staggered via is offset by a distance from a second portion of the staggered via.

Example 14 may include elements of any of examples 9 through 13 where forming the staggered via in which a first portion of the staggered via is offset by a distance from a second portion of the staggered via may include: forming the staggered via in which the first portion of the staggered via is offset from the second portion of the staggered via by a distance selected based on a desired inductance value.

Example 15 may include elements of any of examples 9 through 14 where forming the staggered via in which a first portion of the staggered via is offset by a distance from a second portion of the staggered via may include: forming the staggered via in which the first portion of the staggered via offset from the second portion of the staggered via by a distance of 100 micrometers (μm) or less.

Example 16 may include elements of any of examples 9 through 15 where disposing at least one magnetic build-up layer proximate at least a portion of a first surface of a substrate may include: disposing at least one magnetic build-up layer having a permeability of from about 5 to about 10 at frequencies of 5 GHz or less proximate the portion of the first surface of the substrate.

According to example 17, there is provided a semiconductor interconnect system. The system may include: means for disposing at least one magnetic build-up layer proximate at least a portion of a first surface of a substrate; means for forming a plurality of vias in the substrate, each of at least some of the plurality of vias passing through the at least one magnetic build-up layer such that the at least one magnetic build-up layer is disposed about at least a portion of an external perimeter of the respective via; means for forming a plurality of bump pads across at least a portion of a second surface of the substrate, the second surface transversely opposed across a thickness of the substrate to the first surface; means for conductively coupling each of at least a portion of the plurality of bump pads to a respective one of the plurality of vias; means for forming a plurality of conductive ball pads across at least a portion of the first surface of the substrate, each of at least a portion of the plurality of conductive ball pads disposed proximate the at least one magnetic build-up layer, each of the conductive ball pads having a first capacitance at a first frequency; and means for conductively coupling each of at least a portion of the plurality of conductive ball pads to a respective one of the plurality of vias.

Example 18 may include elements of example 17 where the means for disposing at least one magnetic build-up layer proximate at least a portion of a first surface of a substrate may include: means for disposing a plurality of magnetic build-up layers proximate at least a portion of the first surface of the substrate.

Example 19 may include elements of any of examples 17 or 18, and the system may additionally include: means for disposing a metal layer between two of the plurality of magnetic build-up layers.

Example 20 may include elements of any of examples 17 through 19 where the means for forming a plurality of vias in the substrate may include: means for forming at least one staggered via conductively coupled by the metal layer.

Example 21 may include elements of any of examples 17 through 20 where the means for forming at least one staggered via conductively coupled by the metal layer may include: means for forming the staggered via in which a first portion of the staggered via is offset by a distance from a second portion of the staggered via.

Example 22 may include elements of any of examples 17 through 21 where the means for forming the staggered via in which a first portion of the staggered via is offset by a distance from a second portion of the staggered via may include: means for forming the staggered via in which the first portion of the staggered via is offset from the second portion of the staggered via by a distance selected based on a desired inductance value.

Example 23 may include elements of any of claims 17 through 21 where the means forming the staggered via in which a first portion of the staggered via is offset by a distance from a second portion of the staggered via may include: means for forming the staggered via in which the first portion of the staggered via offset from the second portion of the staggered via by a distance of 100 micrometers (μm) or less.

Example 24 may include elements of any of claims 17 through 23 where the means for disposing at least one magnetic build-up layer proximate at least a portion of a first surface of a substrate may include: means for disposing at least one magnetic build-up layer having a permeability of from about 5 to about 10 at frequencies of 5 GHz or less proximate the portion of the first surface of the substrate.

According to example 25, there is provided an electronic device. The electronic device may include: a system substrate and at least one semiconductor package coupled to system substrate. The at least one semiconductor package may include: a semiconductor die; and a semiconductor interconnect, comprising: a substrate having a first surface and a transversely opposed second surface; at least one magnetic build-up layer disposed proximate the first surface of the substrate; a plurality of bump pads to receive the semiconductor die disposed across at least a portion of the second surface of the substrate; a plurality of conductive ball pads having a first capacitance at a first frequency disposed across at least a portion of the surface of the substrate, each of at least some of the plurality of conductive ball pads disposed proximate the at least one magnetic build-up layer; and a plurality of conductive vias, each of the plurality of vias conductively coupling at least one of the plurality of bump pads to a respective one of the plurality of conductive ball pads, the at least one magnetic build-up layer disposed about at least a portion of an external perimeter of each of at least some of the plurality of conductive vias.

Example 26 may include elements of example 25 where the at least one magnetic build-up layer comprises a plurality of magnetic build-up layers.

Example 27 may include elements of example 25 or 26 and the semiconductor interconnect may additionally include a metal layer disposed between two of the plurality of magnetic build-up layers.

Example 28 may include elements of any of examples 25 through 27 where at least a portion of the conductive vias include staggered vias conductively coupled by the metal layer.

Example 29 may include elements of any of examples 25 through 28 where the staggered via comprises a first portion and a second portion offset by a distance from the first portion.

Example 30 may include elements of any of examples 25 through 29 where the distance between the first portion of the staggered via and the second portion of the staggered via is selected based upon a desired inductance value.

Example 31 may include elements of any of examples 25 through 30 where the distance between the first portion of the staggered via and the second portion of the staggered via comprises a distance of 100 micrometers (μm) or less.

Example 32 may include elements of any of examples 25 through 31 where the at least one magnetic build-up layer comprises a magnetic build-up layer having a permeability of from about 5 to about 10 at frequencies of 5 GHz or less.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:
1. A semiconductor interconnect, comprising:
  a substrate having a first surface and a transversely opposed second surface;
  at least one magnetic build-up layer disposed proximate the first surface of the substrate;
  a plurality of bump pads disposed across at least a portion of the second surface of the substrate;

a plurality of conductive ball pads having a first capacitance at a first frequency disposed across at least a portion of the first surface of the substrate, each of at least some of the plurality of conductive ball pads disposed proximate the at least one magnetic build-up layer; and a plurality of conductive vias, each of the plurality of vias conductively coupling at least one of the plurality of bump pads to a respective one of the plurality of conductive ball pads, the at least one magnetic build-up layer disposed about at least a portion of an external perimeter of each of at least some of the plurality of conductive vias.

2. The semiconductor interconnect of claim 1 wherein the at least one magnetic build-up layer comprises a plurality of magnetic build-up layers.

3. The semiconductor interconnect of claim 2 further comprising a metal layer disposed between two of the plurality of magnetic build-up layers.

4. The semiconductor interconnect of claim 3 wherein at least a portion of the conductive vias include staggered vias conductively coupled by the metal layer.

5. The semiconductor interconnect of claim 4 wherein the staggered via comprises a first portion and a second portion offset by a distance from the first portion.

6. The semiconductor interconnect of claim 5 wherein the distance between the first portion of the staggered via and the second portion of the staggered via is selected based upon a desired inductance value.

7. The semiconductor interconnect of claim 5 wherein the distance between the first portion of the staggered via and the second portion of the staggered via comprises a distance of 100 micrometers (μm) or less.

8. The semiconductor interconnect of claim 1 wherein the at least one magnetic build-up layer comprises a magnetic build-up layer having a permeability of from about 5 to about 10 at frequencies of 5 GHz or less.

9. A semiconductor interconnect fabrication method, comprising:
disposing at least one magnetic build-up layer proximate at least a portion of a first surface of a substrate;
forming a plurality of vias in the substrate, each of at least some of the plurality of vias passing through the at least one magnetic build-up layer such that the at least one magnetic build-up layer is disposed about at least a portion of an external perimeter of the respective via;
forming a plurality of bump pads across at least a portion of a second surface of the substrate, the second surface transversely opposed across a thickness of the substrate to the first surface,
conductively coupling each of at least a portion of the plurality of bump pads to a respective one of the plurality of vias; and
forming a plurality of conductive ball pads across at least a portion of the first surface of the substrate, each of at least a portion of the plurality of conductive ball pads disposed proximate the at least one magnetic build-up layer, each of the conductive ball pads having a first capacitance at a first frequency; and
conductively coupling each of at least a portion of the plurality of conductive ball pads to a respective one of the plurality of vias.

10. The method of claim 9 wherein disposing at least one magnetic build-up layer proximate at least a portion of a first surface of a substrate comprises:
disposing a plurality of magnetic build-up layers proximate at least a portion of the first surface of the substrate.

11. The method of claim 10 further comprising:
disposing a metal layer between two of the plurality of magnetic build-up layers.

12. The method of claim 11 wherein forming a plurality of vias in the substrate comprises:
forming at least one staggered via conductively coupled by the metal layer.

13. The method of claim 12 wherein forming at least one staggered via conductively coupled by the metal layer comprises:
forming the staggered via in which a first portion of the staggered via is offset by a distance from a second portion of the staggered via.

14. The method of claim 13 wherein forming the staggered via in which a first portion of the staggered via is offset by a distance from a second portion of the staggered via comprises:
forming the staggered via in which the first portion of the staggered via is offset from the second portion of the staggered via by a distance selected based on a desired inductance value.

15. The method of claim 13 wherein forming the staggered via in which a first portion of the staggered via is offset by a distance from a second portion of the staggered via comprises:
forming the staggered via in which the first portion of the staggered via offset from the second portion of the staggered via by a distance of 100 micrometers (μm) or less.

16. The method of claim 9 wherein disposing at least one magnetic build-up layer proximate at least a portion of a first surface of a substrate comprises:
disposing at least one magnetic build-up layer having a permeability of from about 5 to about 10 at frequencies of 5 GHz or less proximate the portion of the first surface of the substrate.

17. An electronic device, comprising:
a system substrate;
at least one semiconductor package that includes:
a semiconductor die; and
a semiconductor interconnect, comprising:
a substrate having a first surface and a transversely opposed second surface;
at least one magnetic build-up layer disposed proximate the first surface of the substrate;
a plurality of bump pads to receive the semiconductor die disposed across at least a portion of the second surface of the substrate;
a plurality of conductive ball pads having a first capacitance at a first frequency disposed across at least a portion of the first surface of the substrate, each of at least some of the plurality of conductive ball pads disposed proximate the at least one magnetic build-up layer; and
a plurality of conductive vias, each of the plurality of vias conductively coupling at least one of the plurality of bump pads to a respective one of the plurality of conductive ball pads, the at least one magnetic build-up layer disposed about at least a portion of an external perimeter of each of at least some of the plurality of conductive vias.

* * * * *